(12) United States Patent
Fenwick

(10) Patent No.: US 8,916,906 B2
(45) Date of Patent: Dec. 23, 2014

(54) BORON-CONTAINING BUFFER LAYER FOR GROWING GALLIUM NITRIDE ON SILICON

(75) Inventor: William E. Fenwick, Livermore, CA (US)

(73) Assignee: Kabushiki Kaisha Toshiba, Tokyo (JP)

( * ) Notice: Subject to any disclaimer, the term of this patent is extended or adjusted under 35 U.S.C. 154(b) by 148 days.

(21) Appl. No.: 13/194,744

(22) Filed: Jul. 29, 2011

(65) Prior Publication Data
US 2013/0026482 A1    Jan. 31, 2013

(51) Int. Cl.
*H01L 21/02*      (2006.01)
*H01L 29/267*      (2006.01)
*H01L 33/00*      (2010.01)

(52) U.S. Cl.
CPC ........ *H01L 29/267* (2013.01); *H01L 21/02381* (2013.01); *H01L 21/02458* (2013.01); *H01L 21/02502* (2013.01); *H01L 21/0254* (2013.01); *H01L 21/0262* (2013.01); *H01L 33/007* (2013.01)
USPC ....... 257/190; 257/76; 257/200; 257/E33.025

(58) Field of Classification Search
CPC .................. H01L 21/02304; H01L 21/02381; H01L 21/02458; H01L 21/0254; H01L 21/2015
USPC .............................. 257/76, 190, 200, E33.025
See application file for complete search history.

(56) References Cited

U.S. PATENT DOCUMENTS

| 5,306,662 | A | 4/1994 | Nakamura et al. |
|---|---|---|---|
| 5,408,120 | A | 4/1995 | Manabe et al. |
| 5,432,808 | A | 7/1995 | Hatano et al. ............. 372/45.01 |
| 5,468,678 | A | 11/1995 | Nakamura et al. |
| 5,563,422 | A | 10/1996 | Nakamura et al. |
| 5,578,839 | A | 11/1996 | Nakamura et al. |
| 5,734,182 | A | 3/1998 | Nakamura et al. |

(Continued)

FOREIGN PATENT DOCUMENTS

| JP | 4267376 A | 2/1991 |
|---|---|---|
| JP | 2626431 | 5/1994 |

(Continued)

OTHER PUBLICATIONS

Mike Cooke, "High-Brightness Nitride LEDs on Silicon Through Wafer Bonding", Jun. 4, 2011. (URL: "http://www.semiconductor-today.com/news_items/2011/JUNE/KOREAPHOTONICS_040611.html") (4 pages).

(Continued)

*Primary Examiner* — Jay C Kim
(74) *Attorney, Agent, or Firm* — Hogan Lovells US LLP

(57) ABSTRACT

A silicon wafer used in manufacturing GaN for LEDs includes a silicon substrate, a buffer layer of boron aluminum nitride ($B_xAl_{1-x}N$) and an upper layer of GaN, for which $0.35 \leq x \leq 0.45$. The BAlN forms a wurtzite-type crystal with a cell unit length about two-thirds of a silicon cell unit length on a Si(111) surface. The C-plane of the BAlN crystal has approximately one atom of boron for each two atoms of aluminum. Across the entire wafer substantially only nitrogen atoms of BAlN form bonds to the Si(111) surface, and substantially no aluminum or boron atoms of the BAlN are present in a bottom-most plane of atoms of the BAlN. A method of making the BAlN buffer layer includes preflowing a first amount of ammonia equaling less than 0.01% by volume of hydrogen flowing through a chamber before flowing trimethylaluminum and triethylboron and then a subsequent amount of ammonia through the chamber.

7 Claims, 9 Drawing Sheets

(56) References Cited

U.S. PATENT DOCUMENTS

| | | |
|---|---|---|
| 5,747,832 A | 5/1998 | Nakamura et al. |
| 5,753,939 A | 5/1998 | Sassa et al. |
| 5,766,783 A | 6/1998 | Utsumi et al. ............... 428/698 |
| 5,777,350 A | 7/1998 | Nakamura et al. |
| 5,959,307 A | 9/1999 | Nakamura et al. |
| 5,959,401 A | 9/1999 | Asami et al. |
| 6,005,258 A | 12/1999 | Manabe et al. |
| 6,040,588 A | 3/2000 | Koide et al. |
| RE36,747 E | 6/2000 | Manabe et al. |
| 6,121,635 A | 9/2000 | Watanabe et al. ............... 257/91 |
| 6,215,133 B1 | 4/2001 | Nakamura et al. |
| 6,242,764 B1 | 6/2001 | Ohba et al. ............... 257/190 |
| 6,265,726 B1 | 7/2001 | Manabe et al. |
| 6,326,236 B1 | 12/2001 | Koide et al. |
| 6,420,733 B2 | 7/2002 | Koide et al. |
| 6,541,293 B2 | 4/2003 | Koide et al. |
| 6,610,995 B2 | 8/2003 | Nakamura et al. |
| 6,617,060 B2 | 9/2003 | Weeks, Jr. et al. ............ 428/698 |
| 6,657,236 B1 | 12/2003 | Thibeault et al. |
| 6,800,500 B2 | 10/2004 | Coman et al. |
| 6,838,693 B2 | 1/2005 | Kozaki |
| 6,841,001 B2 | 1/2005 | Saxler |
| 6,849,881 B1 | 2/2005 | Harle et al. |
| 6,891,197 B2 | 5/2005 | Bhat et al. |
| 6,906,352 B2 | 6/2005 | Edmond et al. |
| 6,916,676 B2 | 7/2005 | Sano et al. |
| 6,951,695 B2 | 10/2005 | Xu et al. |
| 6,977,395 B2 | 12/2005 | Yamada et al. |
| 7,026,653 B2 | 4/2006 | Sun |
| 7,106,090 B2 | 9/2006 | Harle et al. |
| 7,112,830 B2 | 9/2006 | Munns |
| 7,115,908 B2 | 10/2006 | Watanabe et al. |
| 7,138,286 B2 | 11/2006 | Manabe et al. |
| 7,193,246 B1 | 3/2007 | Tanizawa et al. |
| 7,247,985 B2 | 7/2007 | Kaneko et al. ............... 313/506 |
| 7,262,436 B2 | 8/2007 | Kondoh et al. |
| 7,312,474 B2 | 12/2007 | Emerson et al. |
| 7,335,920 B2 | 2/2008 | Denbaars et al. |
| 7,345,297 B2 | 3/2008 | Yamazoe et al. |
| 7,348,602 B2 | 3/2008 | Tanizawa |
| 7,402,838 B2 | 7/2008 | Tanizawa et al. |
| 7,442,966 B2 | 10/2008 | Bader et al. |
| 7,446,345 B2 | 11/2008 | Emerson et al. |
| 7,491,565 B2 | 2/2009 | Coman et al. |
| 7,518,154 B2 * | 4/2009 | Otsuka et al. ............... 257/96 |
| 7,547,908 B2 | 6/2009 | Grillot et al. |
| 7,547,925 B2 | 6/2009 | Wong et al. ............... 257/103 |
| 7,611,917 B2 | 11/2009 | Emerson et al. |
| 7,691,651 B2 | 4/2010 | Park ............... 438/22 |
| 7,709,851 B2 | 5/2010 | Bader et al. |
| 7,737,459 B2 | 6/2010 | Edmond et al. |
| 7,754,514 B2 | 7/2010 | Yajima et al. |
| 7,791,061 B2 | 9/2010 | Edmond et al. |
| 7,791,101 B2 | 9/2010 | Bergmann et al. |
| 7,795,623 B2 | 9/2010 | Emerson et al. |
| 7,813,400 B2 | 10/2010 | Denbaars et al. ........ 372/45.011 |
| 7,910,945 B2 | 3/2011 | Donofrio et al. |
| 7,939,844 B2 | 5/2011 | Hahn et al. |
| 7,947,994 B2 | 5/2011 | Tanizawa et al. |
| 7,968,865 B2 | 6/2011 | Laroche et al. ............... 257/11 |
| 8,021,904 B2 | 9/2011 | Chitnis |
| 8,030,665 B2 | 10/2011 | Nagahama et al. |
| 2003/0178642 A1 | 9/2003 | Tanaka et al. ............... 257/200 |
| 2005/0110043 A1 | 5/2005 | Otsuka et al. |
| 2007/0210304 A1 | 9/2007 | Komiyama et al. ............ 257/40 |

FOREIGN PATENT DOCUMENTS

| | | |
|---|---|---|
| JP | 2681733 | 5/1994 |
| JP | 2917742 | 6/1994 |
| JP | 2827794 | 8/1994 |
| JP | 2778405 | 9/1994 |
| JP | 2803741 | 9/1994 |
| JP | 2785254 | 1/1995 |
| JP | 8264894 A | 3/1995 |
| JP | 2735057 | 3/1996 |
| JP | 2956489 | 3/1996 |
| JP | 2666237 | 12/1996 |
| JP | 2890396 | 12/1996 |
| JP | 3250438 | 12/1996 |
| JP | 3135041 | 6/1997 |
| JP | 11040847 A | 7/1997 |
| JP | 3209096 | 12/1997 |
| JP | 3506874 | 1/1998 |
| JP | 3654738 | 2/1998 |
| JP | 3795624 | 2/1998 |
| JP | 3304787 | 5/1998 |
| JP | 3344257 | 8/1998 |
| JP | 3223832 | 9/1998 |
| JP | 3374737 | 12/1998 |
| JP | 3314666 | 3/1999 |
| JP | 3748011 B2 | 6/1999 |
| JP | 4118370 | 7/1999 |
| JP | 4118371 | 7/1999 |
| JP | 3548442 | 8/1999 |
| JP | 3622562 | 11/1999 |
| JP | 3424629 | 8/2000 |
| JP | 4860024 | 8/2000 |
| JP | 3063756 | 9/2000 |
| JP | 4629178 | 9/2000 |
| JP | 3063757 | 10/2000 |
| JP | 3511970 | 10/2000 |
| JP | 3551101 | 5/2001 |
| JP | 3427265 | 6/2001 |
| JP | 3646649 | 10/2001 |
| JP | 3780887 | 5/2002 |
| JP | 3890930 | 5/2002 |
| JP | 3786114 | 4/2004 |
| JP | 4904261 | 6/2004 |
| JP | 2004247412 A | 9/2004 |
| WO | 2007078065 A1 | 7/2007 |

OTHER PUBLICATIONS

Bae et al., "Surface Investigation of a Cubic AlN Buffer Layer and GaN Grown on Si(111) and Si(100) as Revealed by Atomic Force Microscopy," Journal of the Korean Physical Society, vol. 49, No. 3, Sep. 2006, pp. 1092-1096 (5 pages).

Dadgar et al., "Epitaxy of GaN on silicon—impact of symmetry and surface reconstruction," New Journal of Physics, vol. 9, No. 389 (2007); IOP Publishing Ltd., http://iopscience.iop.org/1367-2630/9/10/389 (10 pages).

Keyan et al., "Structural analysis of metalorganic chemical vapor deposited AlN nucleation layers on Si(111)," Singapore-MIT Alliance, Jan. 2004, citable URL: http://hdl.handle.net/1721.1/3841 (4 pages).

Taiwan Office Action dated Oct. 13, 2014, corresponding to Taiwan Patent Application No. 101120371.

* cited by examiner

BORON-CONTAINING BUFFER LAYER FOR GROWING GALLIUM NITRIDE ON SILICON

TECHNICAL FIELD

The present invention relates generally to methods of growing gallium nitride on silicon.

BACKGROUND INFORMATION

Thin films of Group III nitride, such as gallium nitride (GaN), are used in the production of efficient optoelectronic light emitters. Conventionally, GaN has been grown directly on sapphire substrates ($Al_2O_3$). The GaN is grown in thin layers as opposed to in a single three-dimensional growth mode in order to achieve a high quality crystalline structure of the epitaxial growth. Growing the epitaxial layers of GaN on silicon as opposed to on sapphire offers considerable cost savings because of the economies of scale from the large production of silicon for the semiconductor industry. A large amount of equipment for the production of crystalline silicon has already been depreciated. That equipment can now be used in the production of light emitting diodes (LEDs).

Current attempts to grow high quality epitaxial layers of GaN on silicon substrates, however, have not been entirely successful. Because of the great difference between the lattice constants and thermal expansion coefficients of GaN and silicon, GaN is not well suited for epitaxial growth directly on a silicon substrate. GaN epitaxial layers often crack upon cooling to room temperature because even at growth temperatures above 1000° C. the lattice constant of GaN is much smaller than that of crystalline silicon. In addition, GaN has a much larger coefficient of thermal expansion than does silicon. So as the layers of GaN grown on silicon at high temperature cool to room temperature, the smaller lattice distance of the GaN crystals relative to the silicon crystals becomes even more pronounced. The GaN layers deposited directly on silicon are subjected to even more tensile stress as they cool and can even cause the underlying silicon substrate to bow.

Consequently, attempts have been made to grow buffer layers between the silicon substrate and the epitaxial GaN layers in order to compensate for the differing lattice constants and thermal expansion coefficients of GaN and silicon. For example, buffer layers of AlN, AlGaN and AlGaInN have been grown between the silicon substrate and the GaN layers. Growing the buffer layers is a costly manufacturing step not only because of the materials used in the buffer layers but also because of the additional time required to grow the buffer layers. A sufficient number of buffer layers each having a sufficient thickness must be grown in order to build up sufficient compressive stress to offset the tensile stress exerted on the GaN crystal lattice by the larger silicon crystal lattice.

Moreover, the quality of the epitaxial GaN layers that can be grown over existing buffer layers has been poor. Current methods of forming buffer layers of AlN and AlGaN have resulted in epitaxial growth of GaN layers that contain structural defects such as discontinuities, dislocations and faults. These defects degrade the morphology and optical properties of the GaN layers, rendering the GaN layers unsuitable for use in high quality LEDs.

A method is sought for growing buffer layers over a silicon substrate faster and more cheaply than currently practiced but yet that allows high quality epitaxial GaN layers with fewer structural defects to be grown over the buffer layers.

SUMMARY

A silicon wafer used in manufacturing crystalline gallium nitride (GaN) for light emitting diodes (LEDs) includes a silicon substrate, a buffer layer of boron aluminum nitride, a second buffer layer of aluminum gallium nitride ($Al_xGa_{1-x}N$), and an upper layer of GaN. The boron aluminum nitride buffer layer has a composition $B_xAl_{1-x}N$ in which $0.35 \leq x \leq 0.45$. The silicon wafer has a diameter of at least 200 millimeters and an Si(111)1×1 surface (as opposed to a Si(111)7×7 reconstructed surface). The BAlN buffer layer overlies the Si(111) surface of the substrate and is between 100 to 150 nanometers thick. The second buffer layer of aluminum gallium nitride is disposed between the buffer layer of boron aluminum nitride and the upper layer of gallium nitride.

Adding boron to the aluminum nitride layer reduces the lattice size and allows more compressive stress to be built up in thinner buffer layers than by using aluminum nitride alone. By adding a predetermined amount of boron, BAlN is grown with a wurtzite-type crystal structure having a cell unit length that is about two-thirds of a cell unit length of silicon on the Si(111) surface. By adding the predetermined amount of boron, the C-plane of the BAlN crystal has approximately one atom of boron for each two atoms of aluminum. Enough boron is grown into the hexagons of aluminum atoms of an aluminum nitride layer such that the lattice size of BAlN is reduced and forms a regular lattice mismatch in which every third BAlN cell unit bonds well to every second silicon cell unit. The regular mismatch creates a smooth interface morphology between the BAlN nucleation layer and the Si(111) surface of the silicon substrate.

Across the entire wafer substantially only nitrogen atoms of BAlN form bonds to the Si(111) surface. Across the entire wafer substantially no aluminum or boron atoms of the BAlN are present in a bottom most plane of atoms of the BAlN, and substantially only nitrogen atoms of the BAlN are present in the bottom most plane of atoms of the BAlN. Because only nitrogen atoms are present in the bottom most plane, BAlN forms as a single polarity material with fewer dislocations, which produces a smoother interface morphology between the BAlN and the Si(111) surface. The silicon and BAlN are oriented as BAlN<0001>∥Si<111>. No amount of metallic aluminum is disposed between the silicon substrate and the BAlN buffer layer. In addition, no layer of $SiN_x$ is present between the silicon substrate and the BAlN buffer layer.

A method of making a BAlN buffer layer includes preflowing a first small amount of ammonia before flowing trimethylaluminum and triethylboron in order to form single polarity BAlN. The crystallinity of the BAlN buffer layer is influenced by the quality of the initial nucleation layer of BAlN and the nature of the atomic bonding between the BAlN and the silicon(111) surface. Because of the ammonia preflow step, the initial nucleation layer of BAlN begins to grow with only nitrogen atoms bonded to the silicon(111) surface over the entire surface of the silicon wafer.

In a first cleaning step, a substrate of silicon (Si) is heated to a temperature above 950° C. in a reaction chamber of a metal-organic chemical vapor deposition (MOCVD) device. Then hydrogen ($H_2$) is flowed through the chamber in an amount between 106 and 118 cubic centimeters of hydrogen per minute over each square centimeter of the surface of the silicon substrate. In one aspect, the temperature in the chamber during the flowing of hydrogen is above 1100° C.

In the ammonia preflow step, a first amount of ammonia is flowed through the reaction chamber while the hydrogen is still flowing through the chamber. The first amount of ammonia is less than 0.01% by volume of the hydrogen flowing through the chamber. The first amount of ammonia does not exceed 0.006 cubic centimeters per minute over each square centimeter of the surface of the silicon substrate. The ammonia preflow step is performed for between thirty seconds to three minutes. The temperature in the chamber during the ammonia preflow step is between 1000° C. and 1050° C.

Then, trimethylaluminum ($Al_2(CH_3)_6$, TMAl) and triethylboron ($B_2(CH_2CH_3)_6$, TEB) are flowed through the chamber while the hydrogen and first amount of ammonia are still flowing through the chamber. The trimethylaluminum and triethylboron are flowed through the chamber for between ten to fifteen minutes in a combined amount of about ninety micromoles per minute.

Then a subsequent amount of ammonia is flowed through the chamber while the trimethylaluminum and triethylboron are still flowing through the chamber. The subsequent amount of ammonia is greater than 0.002% by volume of the hydrogen flowing through the chamber. In one aspect, the subsequent amount of ammonia flowed through the chamber is just under 5% of the total amount of hydrogen, trimethylaluminum, triethylboron and ammonia.

A device used in manufacturing LEDs includes a silicon substrate, a wurtzite-type crystal lattice including aluminum and nitrogen atoms, and a means for reducing the size of the wurtzite-type crystal lattice. The substrate of silicon has an Si(111) surface. A silicon crystal lattice is present across the Si(111) surface with cell units of a first length. The wurtzite-type crystal lattice has a C-plane that is parallel to the Si(111) surface, and cell units in the C-plane having a second length. The means is incorporated into the wurtzite-type crystal lattice and decreases the second length of the cell units of the wurtzite-type crystal lattice such that three times the second length equals twice the first length.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to some embodiments of the invention, examples of which are illustrated in the accompanying drawings.

Figure 1:
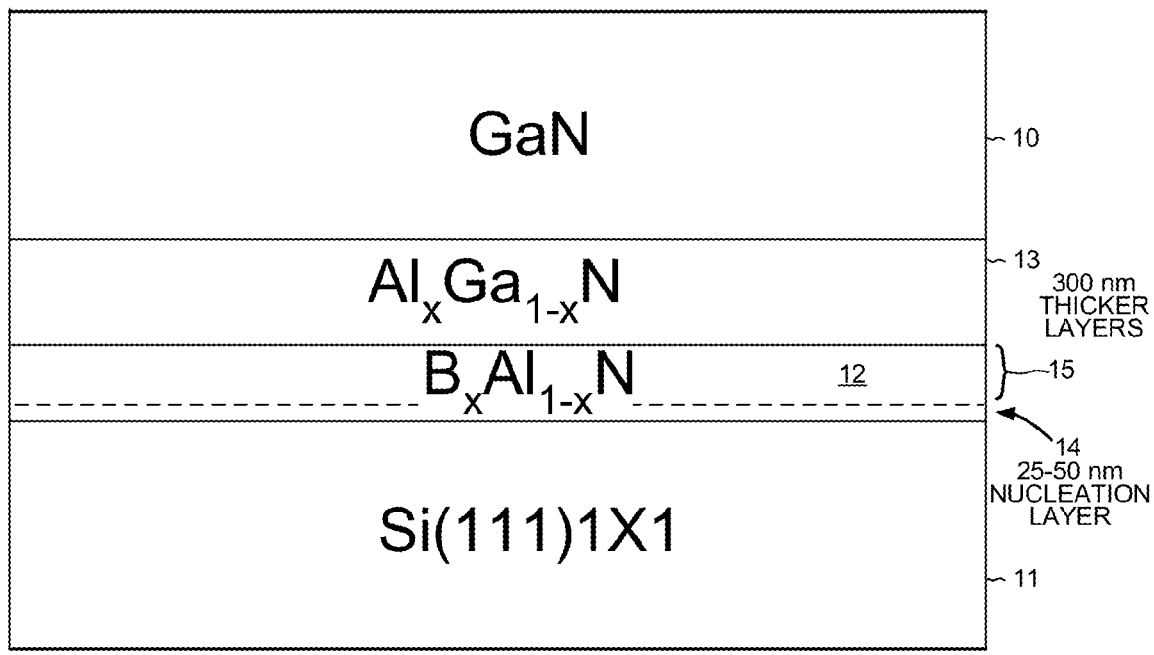
FIG. 1 is a cross-sectional view showing the growth of a single crystal GaN layer on buffer layers of BAlN and AlGaN over a silicon substrate.

FIG. 1 is a schematic diagram showing the growth of a single crystal GaN layer 10 on buffer layers over a silicon substrate 11 in a first embodiment of the present invention. A buffer layer of boron-aluminum nitride ($B_xAl_{1-x}N$) 12 is first grown on the silicon substrate 11. Then higher buffer layers of aluminum gallium nitride ($Al_xGa_{1-x}N$) 13 are grown over the boron-aluminum nitride layer 12. Finally, the GaN layer 10 is grown over the top layer of aluminum gallium nitride 13. In some embodiments, the GaN layer includes several sublayers. The buffer layer of boron-aluminum nitride 12 is made up of a lower initial nucleation layer 14 and thicker upper layers 15.

There are several reasons for first growing buffer layers on a silicon substrate before the gallium nitride (GaN) layer 10 is grown. First, meltback etching of the silicon substrate 11 by gallium occurs if the gallium is allowed to react directly with the silicon substrate. The reaction between gallium and silicon results in poor crystal quality and morphology of the GaN layer 10. Second, $SiN_x$ can be formed as GaN is deposited on silicon, which leads to a 3-dimensional growth of GaN crystals instead of a 2-dimensional growth over the entire surface of the silicon substrate before the GaN layer thickens. Three-dimensional crystal growth leads to a lower quality GaN layer than does 2-dimensional crystal growth. Third, the lattice mismatch between GaN and crystalline silicon causes a large tensile strain on the GaN layer at the interface with the silicon. The lattice mismatch at room temperature between GaN and the hexagonal surface orientation of silicon Si(111) is about 16.9%. Fourth, the in-plane thermal expansion coefficients of GaN and Si(111) vary widely ($5.59 \times 10^{-6} K^{-1}$ for GaN and $2.6 \times 10^{-6} K^{-1}$ for Si). The difference in thermal expansion coefficients can result in cracking of the GaN layer upon cooling from the growth temperature to room temperature.

To solve the problems caused by growing GaN directly on silicon, buffer layers are typically deposited between the silicon and the GaN. For example, a layer of aluminum nitride (AlN) can first be grown on the silicon substrate 11, followed by the additional buffer layers 13 of aluminum gallium nitride ($Al_xGa_{1-x}N$). The aluminum nitride layer and the other buffer layers alleviate much of the four problems described above. First, the aluminum nitride buffer layer does not allow gallium to come into contact with the silicon substrate 11. Second, GaN is not grown directly on the silicon substrate, so the formation of amorphous $SiN_x$ can be prevented on the surface of the silicon, which would otherwise degrade the crystal formation of the GaN. Third, by adding buffer layers the lattice mismatch at the interface between the top buffer layer and the GaN layer is considerably less than would be the mismatch between GaN and Si(111). The lattice mismatch between GaN and Si(111) is compensated by the smaller lattice constant of aluminum nitride that applies compressive stress to the GaN to counteract the tensile stress of GaN from the underlying Si(111). Fourth, the smaller lattice constant of aluminum nitride compensates for the greater proportionate shrinking of the GaN crystal compared to the silicon crystal as both cool from the growth temperature to room temperature.

Growing the aluminum nitride and aluminum gallium nitride buffer layers, however, adds to the cost of manufacturing because of the materials used in the buffer layers and also because of the additional time required to grow the buffer layers. It can take hours to grow a sufficient number of buffer layers that have a sufficient thickness to build up the compressive stress to offset the tensile stress exerted on the GaN crystal lattice by the larger silicon crystal lattice.

The buffer layers cannot be grown arbitrarily quickly because the quality of the crystal lattice of the buffer layers must be maintained. The quality of the GaN layer and the other epitaxial layers is dependent on the quality of the buffer layers below. Simply growing a layer of aluminum nitride, for example, to solve the aforementioned four problems that result from growing GaN directly on silicon will not necessarily result in high-quality GaN. The properties of the lowest nucleation buffer layer 14, such as its dislocation density and surface morphology, are critical in influencing the properties of the higher epitaxial layers. The nucleation layer acts as a crystallographic template for the higher buffer layers and ultimately for the GaN layer 10. The properties of the lowest buffer layer, in turn, are determined in large part by the conditions under which the growth of the aluminum nitride is initiated and by how the silicon substrate 11 is treated prior to growth of the aluminum nitride.

It would seem that achieving a low dislocation density in an aluminum nitride layer grown over Si(111) would be prevented by the 23.4% lattice mismatch between aluminum nitride and Si(111). The distance between silicon atoms in the (111) plane of a silicon crystal is 3.840 angstroms, whereas the distance between aluminum atoms or between nitrogen atoms in the C-plane of wurtzite boron-aluminum nitride is 3.112 angstroms. Smooth interface morphology between aluminum nitride and Si(111) can still be achieved, however, due to the lattice coincidence between the (111) plane of silicon and the C-plane of aluminum nitride which permits the relaxation of the crystal stress at regular intervals of misfit dislocation at the aluminum nitride/Si interface. But achieving the same type of misfit dislocations at regular intervals is critical to obtaining the smooth interface morphology.

One method for beginning the growth of the lowest buffer layer that results in a smooth interface between the buffer layer and Si(111) involves growing a nucleation layer of aluminum nitride (AlN) on a silicon substrate. In one aspect, the substrate is an 8-inch silicon wafer cut along the (111) plane.

Figure 2A:
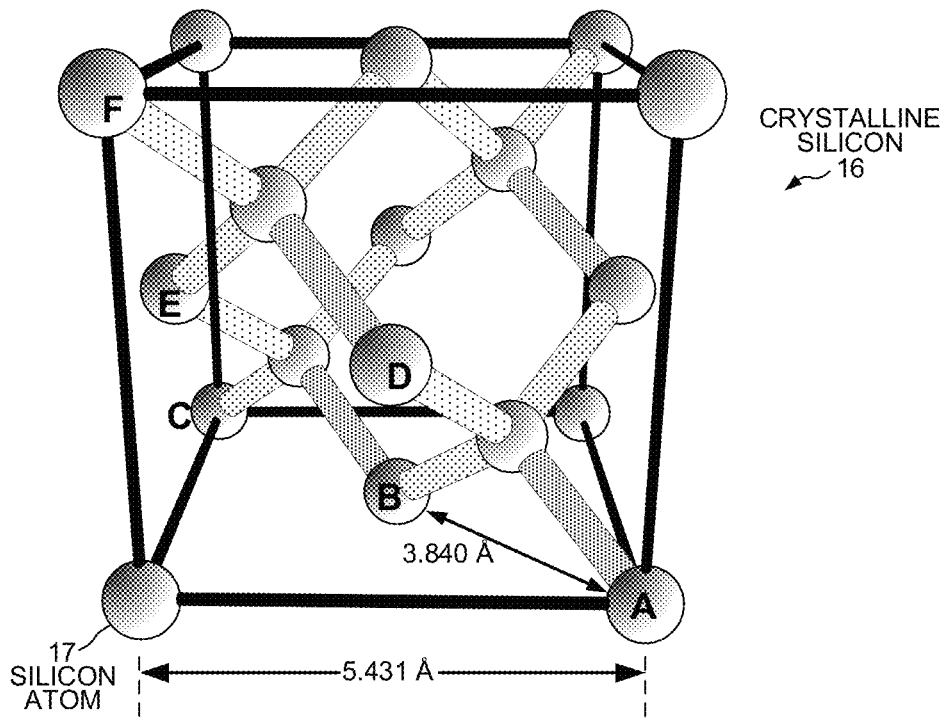
FIG. 2A a model of the crystal structure of silicon.
Figure 2B:
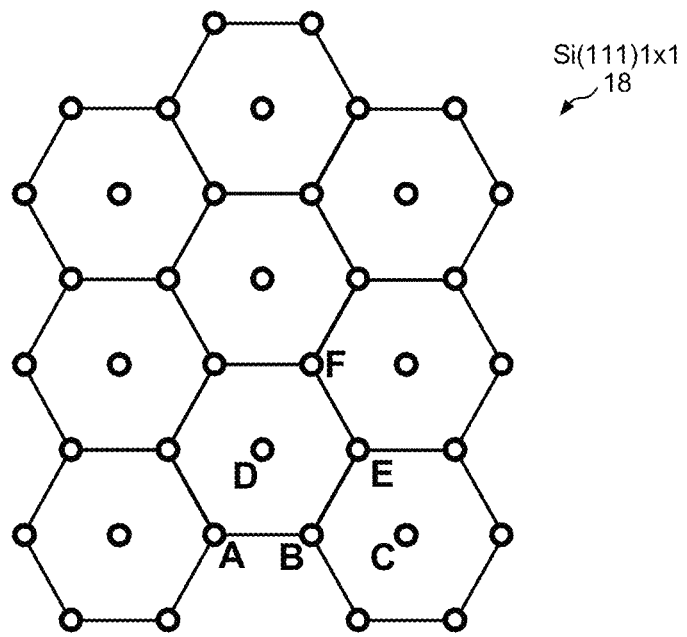
FIG. 2B is a diagram of silicon atoms along a Si(111)1×1 surface of a silicon crystal.

FIG. 2A is a diagram illustrating the crystal structure 16 of silicon. The (111) plane along which the silicon wafer is cleaved is the plane that intersects the silicon atoms A, C and F in FIG. 2A. The silicon atoms A, F and 17 define the (010) plane, in which the silicon atoms form a square format. The distance between silicon atoms at adjacent corners of the squares of the identical (100), (010) and (001) planes is 5.431 angstroms. There is a shorter distance, however, between adjacent silicon atoms of the hexagonal format of the (111) plane. For example, the distance between atoms A and B in the (111) plane is only 3.840 angstroms. This shorter distance between atoms in the hexagonal format of Si(111) better matches the distance between nitrogen atoms in the hexagonal format along the C-plane of aluminum nitride. FIG. 2B illustrates the atoms A-F of FIG. 2A in which the (111) plane coincides with the plane of the page. When the silicon wafer is heated above about 850° C., the surface of the silicon wafer changes from the dimer-adatom-stacking (DAS) fault structure of the Si(111)7×7 reconstruction to the regular Si(111) 1×1 structure 18 shown in FIG. 2B. The more-stable, faceted Si(111)7×7 surface structure breaks down to the regular Si(111)1×1 hexagonal structure 18 when the silicon substrate is heated above about 850° C.

Figure 3:
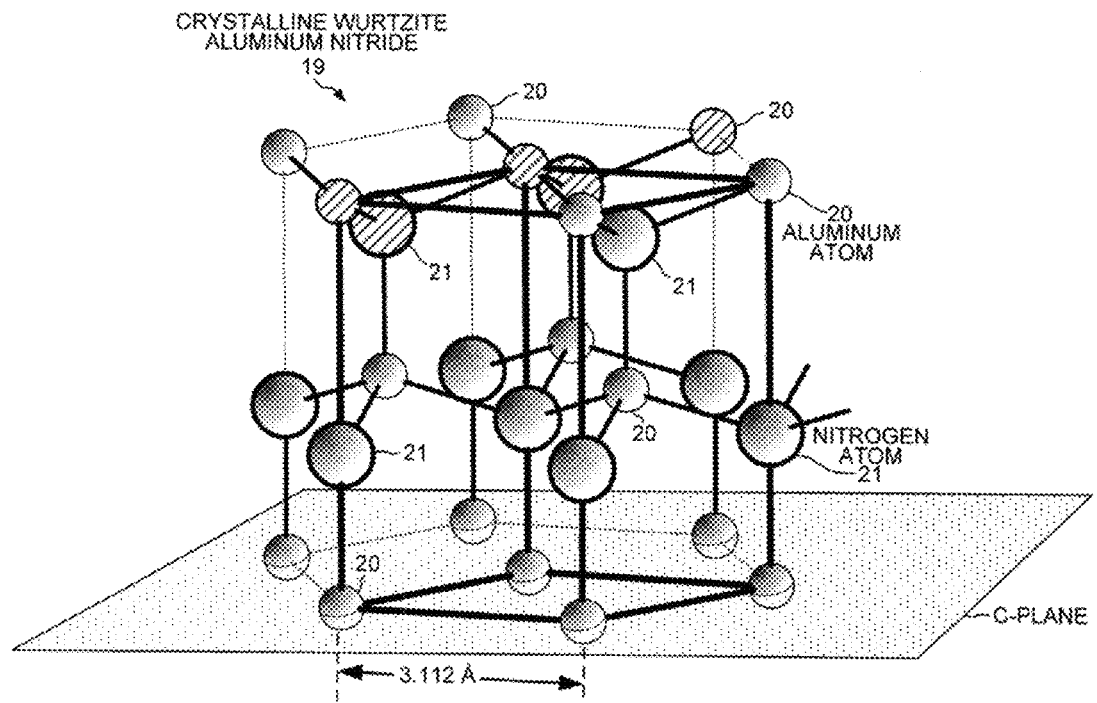
FIG. 3 shows a model of the crystal structure of wurtzite aluminum nitride.

FIG. 3 is a diagram illustrating the crystal structure 19 of wurtzite aluminum nitride (AlN). The smaller spheres represent aluminum atoms 20, and the larger spheres represent nitrogen atoms 21. The C-plane of the aluminum nitride crystal intersects all six aluminum atoms that form hexagons on the top and bottom surfaces of the crystal. The aluminum atoms 20 are held in place in a hexagon because they are bonded to each nitrogen atom 21 at the four corners of a tetrahedron. The distance between adjacent aluminum atoms around the hexagon in the C-plane is about 3.112 angstroms. The distance between adjacent nitrogen atoms around the middle hexagon is therefore also about 3.112 angstroms. The hexagons of nitrogen and aluminum along the C-plane of aluminum nitride approximately match the hexagonal format of silicon atoms on the Si(111)1×1 surface of the silicon substrate.

Figure 4:
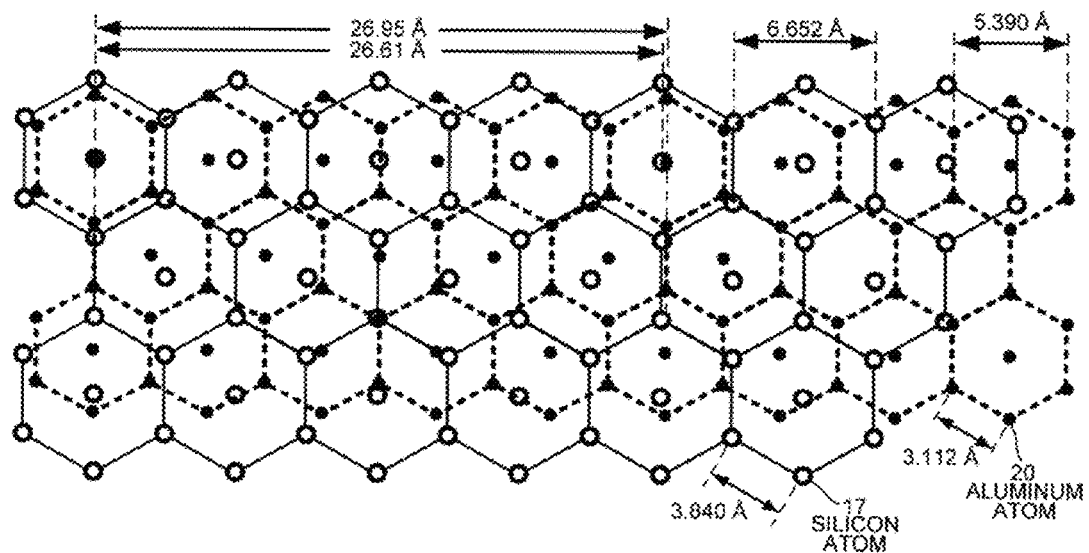
FIG. 4 is a diagram of the crystal structure of the aluminum hexagons in the C-plane of AlN superimposed over the crystal structure of silicon along the Si(111)1×1 surface.

FIG. 4 is a diagram of the crystal structure of the aluminum hexagons in the C-plane of aluminum nitride superimposed over the crystal structure of the silicon substrate on the Si(111)1×1 surface. Because the distance between atoms around the silicon hexagon is 3.840 angstroms and the distance between the atoms around the hexagons of aluminum nitride is 3.112 angstroms, the lattice distance of each silicon cell unit is about 6.652 angstroms and the lattice distance of each aluminum nitride cell unit is about 5.390 angstroms. Thus, there is a 23.4% lattice mismatch. However, the width of five aluminum nitride cell units (26.95 angstroms) approximately matches the width of four silicon cell units (26.61 angstroms), as illustrated in FIG. 4. Every fifth aluminum nitride cell unit can bond well to every fourth silicon cell unit.

Thus, a nucleation layer of AlN having an even topology enabled by the periodic lattice mismatches can be grown over the Si(111)1×1 surface, and that nucleation layer acts as a crystallographic template for the remainder of the AlN buffer layer, higher buffer layers of AlGaN and ultimately for the GaN layer.

The smaller lattice size of the AlN crystal can then be used to build up compressive stress by growing successive buffer layers of aluminum gallium nitride ($Al_xGa_{1-x}N$) with increasingly larger lattice sizes. The composition of each higher buffer layer of aluminum gallium nitride ($Al_xGa_{1-x}N$) contains more gallium and less aluminum in order to generate ever larger lattice sizes. Each upper crystal lattice must fit over a slightly smaller crystal lattice beneath it, thereby compressing the upper lattice. Finally, the gallium nitride layer is grown over the top buffer layer, and the lattice size of the gallium nitride is slightly larger than the top buffer layer of aluminum gallium nitride ($Al_xGa_{1-x}N$), whose x is a small value. The sum of the compressive stresses of each successive buffer layer offsets the tensile stress that results when the gallium nitride layer shrinks more than the silicon substrate shrinks as the wafer cools from growth temperature to room temperature because the thermal expansion coefficient of GaN is $5.59 \times 10^{-6} K^{-1}$ and the thermal expansion coefficient of Si(111) is only $2.6 \times 10^{-6} K^{-1}$.

In order to build up sufficient compressive stress to offset the tensile stress between the GaN and silicon lattices, the buffer layers must be relatively thick. Each lower buffer layer must be robust enough to exert stress on the layer above. If the lower layer is too thin, its lattice will simply be stretched by the larger lattice of the layer above. A lower buffer layer of aluminum nitride is typically about 250 nanometers thick in order to provide a stable base for higher aluminum gallium nitride layers. And the combined thickness of the aluminum gallium nitride layers is typically about three times as thick as the aluminum nitride layer. Growing these thick aluminum nitride and aluminum gallium nitride layers can take several hours.

A method is disclosed for quickly growing buffer layers between a Si(111) surface and gallium nitride. The method allows the buffer layers to be thinner. The thinner buffer layers can be grown faster and use less raw materials. Boron is added to the aluminum nitride layer and/or to the aluminum gallium nitride layers in order to reduce the size of the crystal lattice and to lower the thermal expansion coefficient. The smaller crystal lattice allows the same amount of compressive stress to be built up using thinner buffer layers. The desired lattice size of each successive buffer layer can be achieved even though the lattice of each thin buffer layer is stretched by the larger lattice of the buffer layer above because the lowest buffer layer of boron aluminum nitride begins with an even smaller lattice size. Moreover, the buffer layers can be thinner but yet maintain their stability as they cool because their shrinkage is reduced by the addition of boron. The thermal expansion coefficient of AlN is $4.15 \times 10^{-6} K^{-1}$, whereas the thermal expansion coefficient of BN is only $2.3 \times 10^{-6} K^{-1}$. As more boron atoms replace aluminum atoms in the AlN buffer layer, the thermal expansion coefficient of the boron aluminum nitride decreases from $4.15 \times 10^{-6} K^{-1}$ to $2.3 \times 10^{-6} K^{-1}$.

Again, it would seem that achieving a low dislocation density in the boron aluminum nitride layer grown over Si(111) would not be possible because as boron is added to the aluminum nitride, the 26.95 angstrom length of five AlN cell units would decrease and would no longer match the 26.61 angstrom length of four cell units of Si(111). Therefore, an amount x of boron is chosen such that the total length of an integer number of cell units of $B_xAl_{1-x}N$ approximately equals the total length of an integer number of silicon cell units. A method is disclosed that generates a smooth interface morphology between boron aluminum nitride and Si(111) by enabling regular intervals of misfit dislocation at each two cell units of silicon and three cell units of boron aluminum nitride. Achieving the regular misfit dislocation is critical to obtaining a smooth interface morphology.

Figure 5:
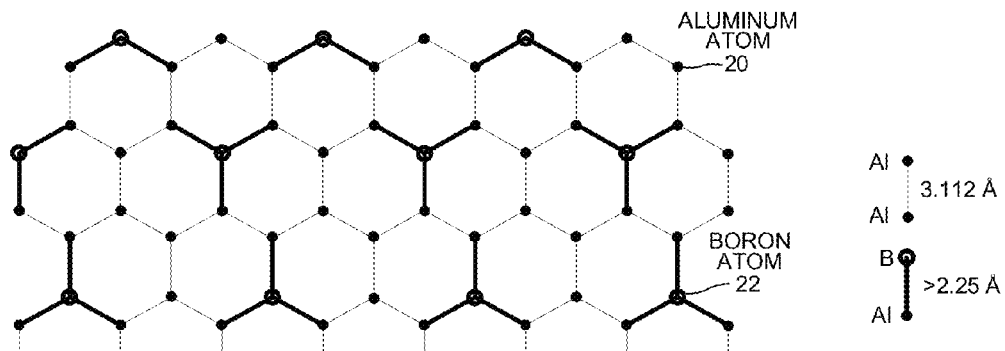
FIG. 5 is a diagram of the top or bottom hexagonal structure of the aluminum nitride crystal of FIG. 4 in which some aluminum atoms have been replaced with boron atoms.

FIG. 5 shows the top or bottom hexagonal structure of the aluminum nitride crystal of FIG. 3 in which some aluminum atoms 20 have been replaced with boron atoms 22. As boron atoms replace aluminum atoms, the distance between a boron atom and aluminum atom becomes smaller than the distance between two aluminum atoms. Although the Al—B bond length is about 2.25 angstroms, the distance between aluminum and boron atoms is somewhat greater when the atoms are held in place in the hexagon rings by the N—Al and N—B bonds. An amount of boron atoms is chosen such that the length of three cell units of boron aluminum nitride will be about 13.30 angstroms, which is about the length of two cell units of Si(111).

Figure 6:
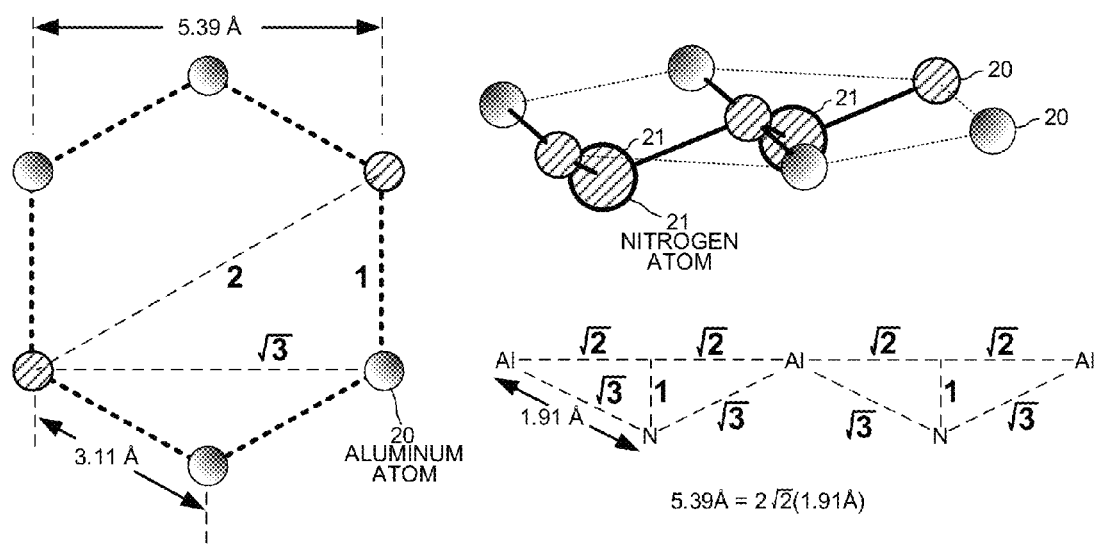
FIG. 6 illustrates the geometry used to calculate the cell unit length of the aluminum nitride crystal of FIG. 4.

FIG. 6 illustrates one method of calculating the cell unit length of aluminum nitride, which is used as a starting point for determining how much boron to add to achieve a cell unit length of 4.43 angstroms (13.30 Å /3). The aluminum-nitrogen bond has a length of about 1.91 angstroms, and nitrogen forms bonds at the tetrahedral angle of 109.5 degrees. Thus, the distance between aluminum atoms on the hexagon rings diagonally across from one another can be calculated using the bonds Al—N—Al—N—Al, as shown in FIG. 6. For an Al—N bond length of 1.91 angstroms, the cell unit length of AlN is 5.39 angstroms.

Figure 7:
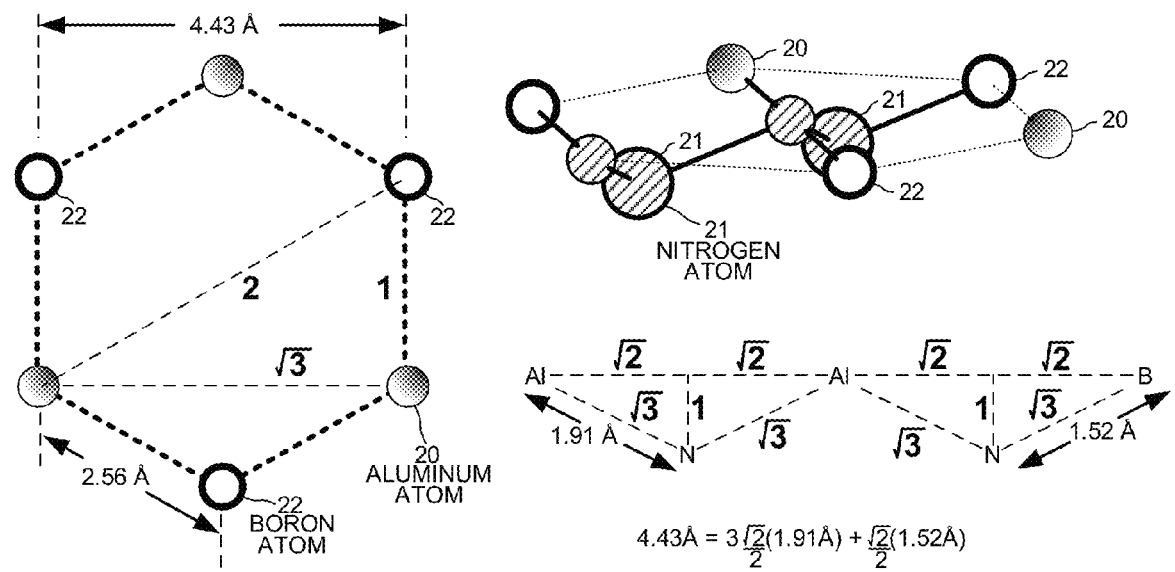
FIG. 7 illustrates the geometry used to calculate the cell unit length of a crystal in which a boron atom replaces every third aluminum atom in the C-plane of the crystal of FIG. 4.

FIG. 7 illustrates why the cell unit length of boron-aluminum nitride is about 4.43 angstroms if every third aluminum atom in a line diagonally across the hexagon rings is replaced with a boron atom. For an Al—N bond length of 1.91 angstroms and a B—N bond length of 1.52 angstroms, the length of the cell unit of BAlN shown in FIG. 7 is about $\sqrt{2}/2(1.52$ Å $+3\{1.91$ Å $\})$, which equals 4.43 angstroms.

Figure 8:
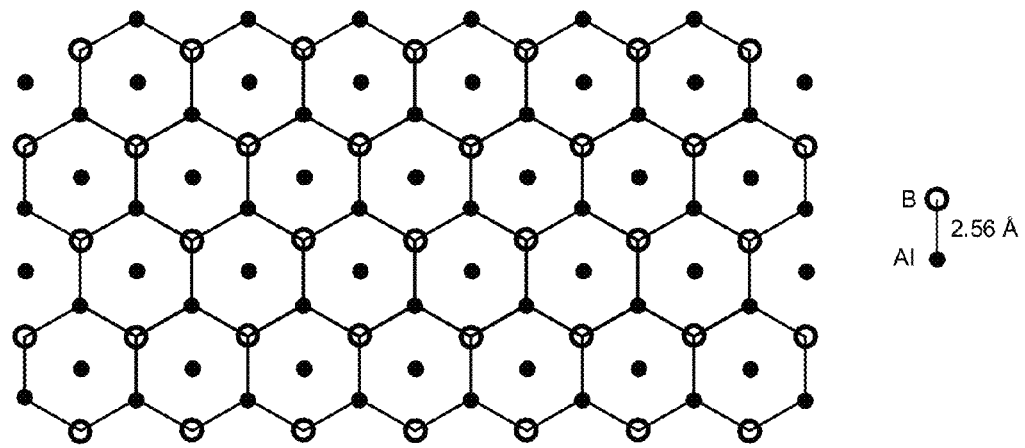
FIG. 8 is a diagram of the C-plane of BAlN in which every third atom of aluminum of AlN has been replaced by a boron atom.

FIG. 8 shows how the C-plane of BAlN appears when every third atom of aluminum of AlN is replaced by a boron atom. In the configuration of BAlN shown in FIG. 8, the distance between boron atoms and adjacent aluminum atoms in the C-plane is about 2.56 angstroms.

Figure 9:
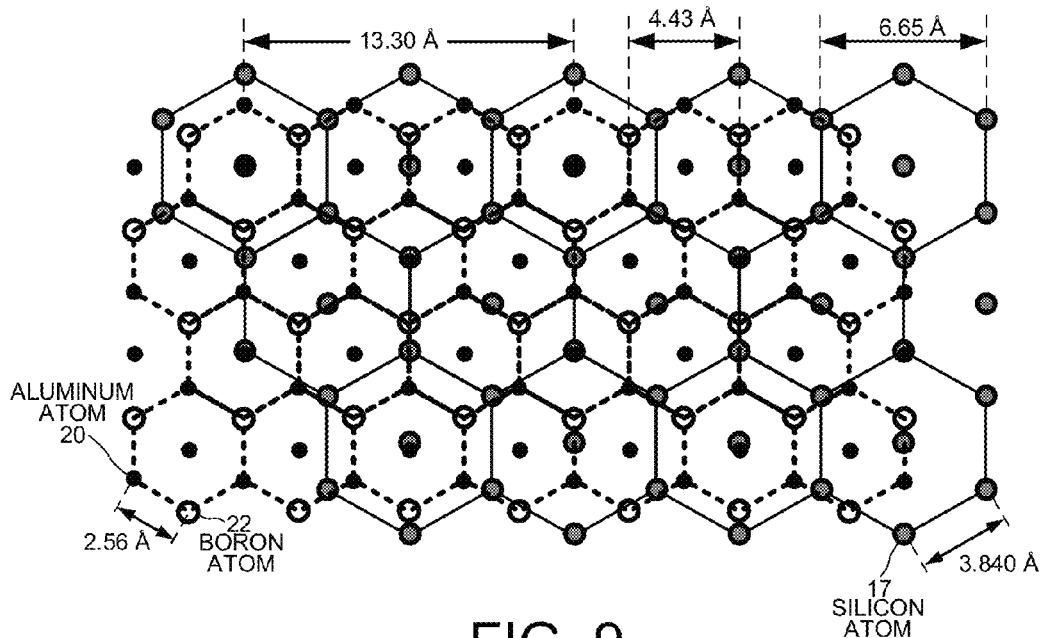
FIG. 9 is a diagram of the crystal structure of hexagons of aluminum and boron in the C-plane of BAlN superimposed over the crystal structure of silicon along the Si(111)1×1 surface.

FIG. 9 is a diagram of the crystal structure of the hexagons of aluminum and boron atoms in the C-plane of boron-aluminum nitride superimposed over the crystal structure of the silicon substrate on the Si(111)1×1 surface. Because the distance between atoms around the silicon hexagon is 3.840 angstroms and the distance between the atoms around the hexagons of boron-aluminum nitride is 2.56 angstroms, the lattice distance of each silicon cell unit is about 6.652 angstroms and the lattice distance of each boron-aluminum nitride cell unit is about 4.43 angstroms. FIG. 9 shows that every third boron-aluminum nitride cell unit can bond well to every second silicon cell unit.

Figure 10:
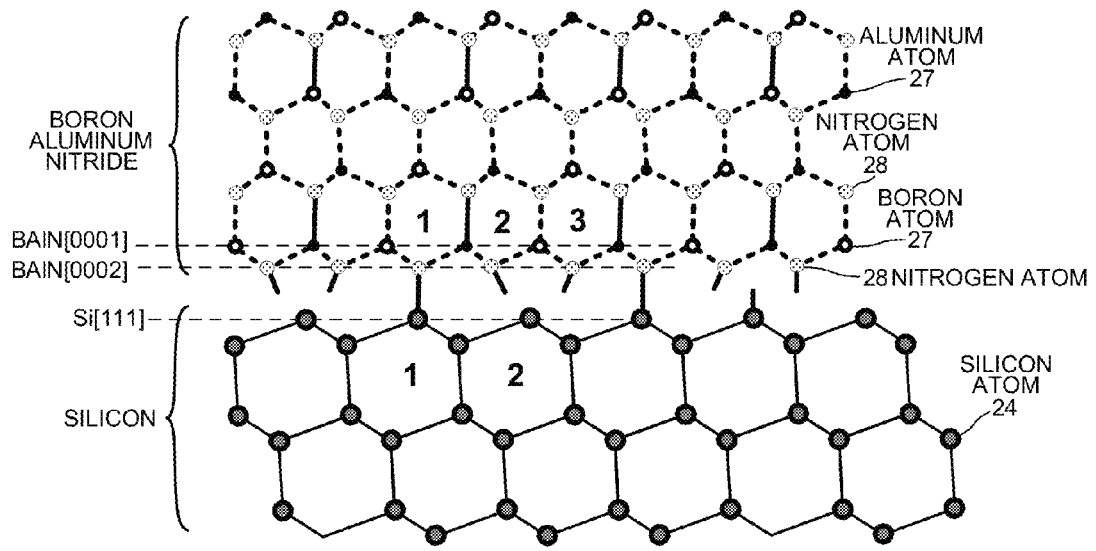
FIG. 10 is a diagram of the crystal structures of a silicon substrate and a BAlN nucleation layer viewed perpendicular to the Si(111) surface.

FIG. 10 is a diagram of the crystal structures of the silicon substrate and boron-aluminum nitride viewed perpendicular to the Si(111)1×1 surface and the C-plane of boron-aluminum nitride. FIG. 10 illustrates how each third cell unit of the boron-aluminum nitride crystal approximately matches each second cell unit on the Si(111)1×1 surface. The regular mismatch between surface structures of boron-aluminum nitride and silicon allows a crystal of boron-aluminum nitride to be grown with a low dislocation density.

The dislocation density of the boron-aluminum nitride buffer layer is considerably higher, however, if not all islands of boron-aluminum nitride crystals that begin to form on the Si(111)1×1 surface have the same polarity. If some islands of boron-aluminum nitride crystals form with nitrogen atoms bonded to the silicon while other islands of boron-aluminum nitride crystals form with either aluminum or boron atoms bonded to the silicon, then discontinuities and stacking faults will form where the islands of crystals having opposite polarity grow together. FIG. 10 shows that the initial nucleation layer of boron-aluminum nitride formed using the disclosed method has only nitrogen atoms bonded to the Si(111)1×1 surface. Across the entire substrate wafer substantially only nitrogen atoms of the boron-aluminum nitride are present in the bottom most plane of atoms of the boron-aluminum nitride. Because the initial nucleation layer of boron-aluminum nitride formed using the disclosed method has a single polarity, it is possible to grow a GaN layer above the nucleation layer that has a dislocation density of less that $2 \times 10^9$ $cm^{-2}$.

Figure 11:
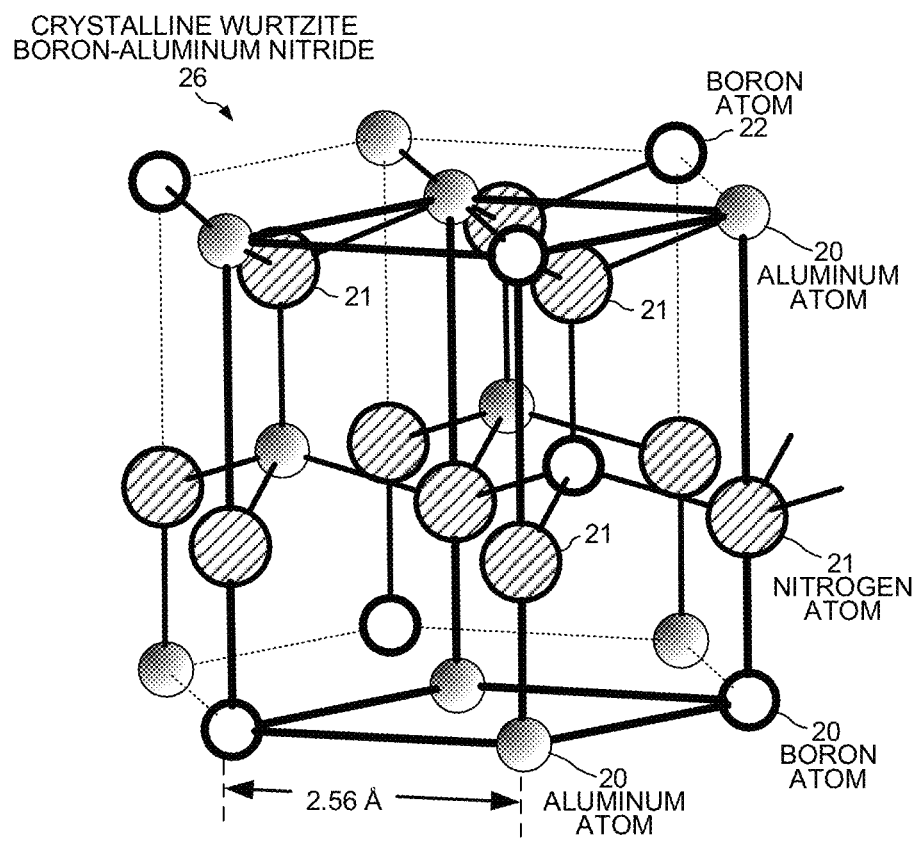
FIG. 11 shows a model of the crystal structure of wurtzite boron aluminum nitride in which a boron atom replaces every third aluminum atom in the C-plane of the crystal.

FIG. 11 is a diagram illustrating the crystal structure 19 of wurtzite aluminum nitride (AlN). The thick-shelled spheres represent boron atoms 22, the thin-shelled spheres represent aluminum atoms 20, and the cross-hashed spheres represent nitrogen atoms 21. The C-plane of the boron-aluminum nitride crystal intersects three aluminum atoms and three boron atoms that form a hexagon on the top surface of the crystal. A hexagon of nitrogen or a hexagon of boron/aluminum along the C-plane of boron-aluminum nitride matches each second hexagon of silicon atoms on the Si(111)1×1 surface of the silicon substrate.

Each wurtzite crystal of boron-aluminum nitride with the composition shown in FIG. 11 has seven boron atoms for each 10 aluminum atoms. Boron-aluminum nitride has the same number of nitrogen atoms as the combined number of boron and aluminum atoms. So the composition of the boron-aluminum nitride crystal shown in FIG. 11 is $B_7Al_{10}N_{17}$ or $B_{0.41}Al_{0.59}N$. The optimal crystal lattice matching between the smaller boron-aluminum nitride crystal lattice and the larger Si(111) crystal lattice can thus be achieved by growing $B_xAl_{1-x}N$ where $0.35 \leq x \leq 0.45$. Moreover, the optimal crystal lattice matching between the smaller boron-aluminum nitride crystal lattice and the larger Si(111) crystal lattice can be achieved by forming boron-aluminum nitride having a cell unit length in the C-plane that is about two thirds (64% to 68%) of the cell unit length of the silicon on the Si(111) surface.

In addition, by replacing seven of every seventeen aluminum atoms with boron atoms, the thermal expansion coefficient of $B_{0.41}Al_{0.59}N$ is 41% closer to the coefficient of BN than to the coefficient of AlN. The thermal expansion coefficient of $B_{0.41}Al_{0.59}N$ is lowered to $3.4 \times 10^{-6} K^{-1}$. Thus, the buffer layer of $B_{0.41}Al_{0.59}N$ shrinks less than a buffer layer of AlN as the wafer cools from growth temperature to room temperature, and less stress is exerted on the upper GaN layer during cooling.

A method is disclosed for beginning the growth of boron-aluminum nitride that results in a smooth interface between boron-aluminum nitride and Si(111). The method grows a single polarity buffer layer of boron-aluminum nitride having a low dislocation density. The subsequent buffer layers grown over the boron-aluminum nitride buffer layer retain the high quality crystalline form and enable higher quality GaN and other epitaxial layers to be grown over the buffer layers.

Figure 12:
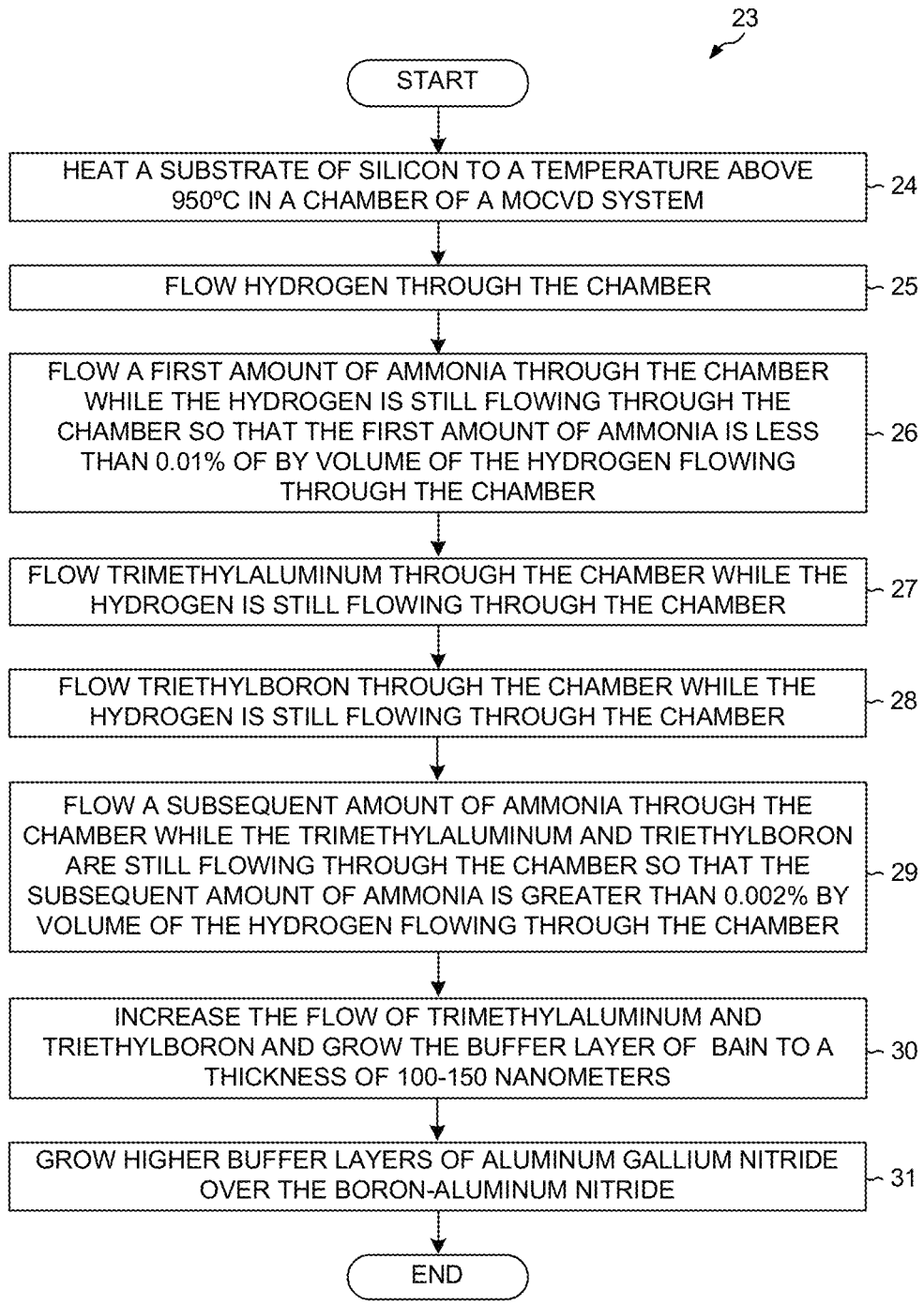
FIG. 12 is a flowchart of a method for growing an initial nucleation layer of BAlN on a silicon substrate.

FIG. 12 is a flowchart illustrating steps of a method 23 for growing a high-quality boron-aluminum nitride nucleation layer on a silicon substrate. In a first step 24, a substrate of silicon (Si) is heated to a temperature above 950° C. in a chamber. In one aspect, the substrate is heated to a temperature of 1140° C. in the reaction chamber of a metal-organic chemical vapor deposition (MOCVD) system (also called a metal-organic vapor phase epitaxy system). The substrate is in the form of three 8-inch silicon wafers cut along the (111) plane. The three wafers are placed on a wafer receptacle having a diameter of 465 millimeters.

In step 25, hydrogen is flowed through the chamber in order to remove $SiO_2$ from the wafers and generally to clean the surface of the silicon substrate. Between 106 and 118 cubic centimeters of hydrogen per minute flow over each square centimeter of the surface of the substrate. In one aspect, 180-200 liters of hydrogen per minute is flowed through the chamber. The silicon substrate is baked in the hydrogen flow at 1140° C. for about fifteen minutes to remove the native oxide. Then, the temperature in the chamber is lowered to about 1020° C.

In step 26, a first amount of ammonia (NH3) is flowed through the chamber while the hydrogen is still flowing through the chamber. The first amount of ammonia is less than 0.01% of by volume of the hydrogen flowing through the chamber. The first amount of ammonia is flowed through the chamber for between thirty seconds to three minutes. In one aspect, less than ten cubic centimeters of ammonia per minute is flowed over the 465-mm wafer receptacle. Thus, less than 0.00588 cubic centimeters per minute of ammonia flows over each square centimeter of the surface of the silicon substrate. At 1020° C., the first amount of ammonia is insufficient to form a layer of $SiN_x$ over the surface of the silicon substrate. The first amount of ammonia is, however, sufficient to form a small number of Si—N bonds on the Si(111)1×1 surface.

In step 27, an alkyl-aluminum precursor such as trimethylaluminum ($Al_2(CH_3)_6$) is flowed through the chamber while the hydrogen is still flowing through the chamber. The trimethylaluminum flows through the chamber in an amount of about fifty micromoles per minute. In one aspect, fifty micromoles per minute of trimethylaluminum flowed through the chamber for between ten to twenty minutes.

In step 28, an alkyl-boron precursor such as triethylboron ($B_2(CH_2CH_3)_6$, TEB) is flowed through the chamber while the hydrogen is still flowing through the chamber. The triethylboron flows through the chamber in an amount of about forty micromoles per minute. In one aspect, forty micromoles per minute of triethylboron flows through the chamber for between ten to fifteen minutes. When the triethylboron is added to the chamber, the temperature is increased from about 1020° C. to about 1150° C. and the pressure is increased from about 50 Torr to about 55 Torr in order to assist in the incorporation of boron in to the wurtzite crystal of boron-aluminum nitride.

In step 29, a subsequent amount of ammonia is flowed through the chamber while the trimethylaluminum and triethylboron are still flowing through the chamber. The subsequent amount of ammonia is greater than 0.002% by volume of the hydrogen flowing through the chamber. In one aspect, the subsequent amount of ammonia that flows through the chamber is just under 5% of the total amount of hydrogen, ammonia, trimethylaluminum and triethylboron. When the subsequent amount of ammonia flows through the chamber at just under 5% of the total flow for about fifteen minutes, an initial nucleation layer 14 of boron-aluminum nitride ($B_{0.41}Al_{0.59}N$) grows to a thickness of between 25-50 nanometers. The crystallinity of the boron-aluminum nitride buffer layer 12 is related to the quality of the initial nucleation layer 14 and the nature of the atomic bonding between the silicon (111) surface and the boron-aluminum nitride. Because of the ammonia preflow in step 26, the initial nucleation layer 14 begins to grow with only nitrogen atoms bonded to the silicon (111) surface over the entire surface of the 8-inch wafers.

In a step 30, the flow of trimethylaluminum and triethylboron are increased, the temperature in the chamber is increased, and the buffer layer of boron-aluminum nitride is grown an additional 75-100 nanometers to a total thickness of about 100 to 150 nanometers under the increased flow. In step 30, the flow of trimethylaluminum is increased to about 100 micromoles per minute, and the flow of triethylboron is increased to about 70 micromoles per minute. The temperature in the chamber is increased to about 1120° C.

In a step 31, higher buffer layers of aluminum gallium nitride ($Al_xGa_{1-x}N$) 13 are grown over the boron-aluminum nitride layer 12. For example, three layers of aluminum gallium nitride are grown with increasing amounts of gallium. Each layer of aluminum gallium nitride is grown to a thickness of about 100 nanometers in about twenty minutes. Thus, the entire buffer layers of $B_xAl_{1-x}N$ and $Al_xGa_{1-x}N$ can be grown to a thickness of about 400 nanometers is about 1.25 hours.

Figure 13:
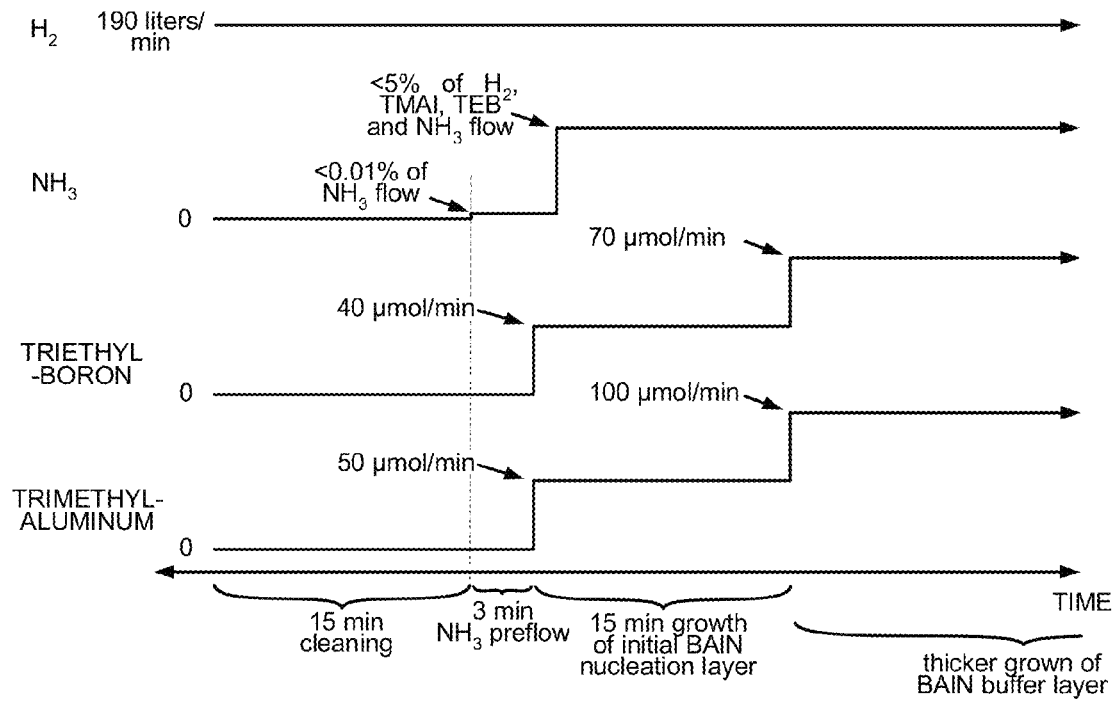
FIG. 13 is a graph of gas flows of hydrogen, trimethylaluminum, triethylboron and ammonia through a reaction chamber during the method of FIG. 12.

FIG. 13 is a graph that represents the flows of hydrogen, ammonia, trimethylaluminum and triethylboron through the reaction chamber during the cleaning, preflow, initial growth and thicker growth stages of the formation of the boron-aluminum nitride buffer layer. In other embodiments, the additional 75-100 nanometers of boron-aluminum nitride are grown in multiple stages of higher trimethylaluminum and triethylboron concentrations as opposed to in one step.

The initial nucleation layer 14 of boron-aluminum nitride first starts to form when the trimethylaluminum and triethylboron start flowing through the chamber in steps 27-28 and before the subsequent amount of ammonia is flowed through the chamber in step 29. Consequently, a very small amount of nitrogen is present on the Si(111)1×1 surface of the silicon substrate 11 before the aluminum from the trimethylaluminum and boron from the triethylboron come into contact with the substrate surface. As the first seed crystals of boron-aluminum nitride are formed, the aluminum and boron atoms form bonds to the nitrogen atoms that are present on the Si(111)1×1 surface as opposed to directly with silicon atoms on the substrate surface. The nitrogen from the ammonia preflow step ensures that the polarity of the alternating layers of aluminum/boron and nitrogen in the boron-aluminum nitride crystals that are formed across the entire silicon wafer will have a nitrogen layer facing the silicon substrate and an aluminum/boron layer on top.

Some prior methods of growing an aluminum nitride buffer layer begin by depositing a metallic Al layer on the surface of the silicon substrate before the aluminum nitride is grown in order to prevent the formation of amorphous $SiN_x$. The presence of aluminum atoms on surface of the silicon substrate probably causes at least some of the islands of aluminum nitride crystals to form with aluminum as the bottom most plane of atoms of the aluminum nitride. Because these prior art methods do not prevent at least some aluminum atoms from bonding to the silicon substrate, some islands of aluminum nitride crystals form with aluminum as the bottom most plane of atoms of the aluminum nitride, and the resulting aluminum nitride layer has mixed polarity. Method 23, on the other hand, allows a single polarity material to be grown because the ammonia preflow step prevents aluminum and boron atoms from bonding directly to the silicon substrate.

Thus, method 23 can be used to manufacture a wafer of silicon substrate over which a boron-aluminum nitride buffer layer, AlGaN layers and finally an upper GaN layer are grown. The silicon substrate has an Si(111) surface, which converts from a 7×7 structure to a 1×1 structure when the silicon is heated above about 850° C. The boron-aluminum nitride buffer layer is a means for compensating for the lattice mismatch between the GaN and the Si(111) surface of the silicon substrate so as to enable the upper GaN layer to grow under reduced stress. The AlGaN on top of the boron-aluminum nitride buffer layer is a better lattice match for GaN than is silicon. The silicon substrate is a wafer with a diameter of at least 200 millimeters, such as an 8-inch wafer. The boron-aluminum nitride buffer layer overlies the Si(111) surface of the substrate and is oriented as BAlN<0001>||Si<111>. The upper layer of GaN is grown on the AlGaN layers over the BAlN buffer layer. Across the entire wafer substantially no aluminum or boron atoms of the boron-aluminum nitride are present in a bottom most plane of atoms of the boron-aluminum nitride, and across the entire wafer substantially only nitrogen atoms of the boron-aluminum nitride are present in the bottom most plane of atoms of the boron-aluminum nitride. Thus, across the entire wafer substantially only nitrogen atoms of BAlN form bonds to the Si(111) surface. There is neither metallic aluminum nor any layer of $SiN_x$ present between the silicon substrate and the boron-aluminum nitride buffer layer.

Boron can also be added to the AlGaN buffer layers in order to reduce the lattice constant of the resulting BAlGaN crystal. By creating a smaller lattice distance in the crystal lattice of lower BAlGaN buffer layers, more compressive stress can be built up in successive BAlGaN buffer layers (instead of in a lower BAlN nucleation layer) in order to offset the tensile stress on the GaN layer caused by the larger silicon lattice distance.

Figure 14:
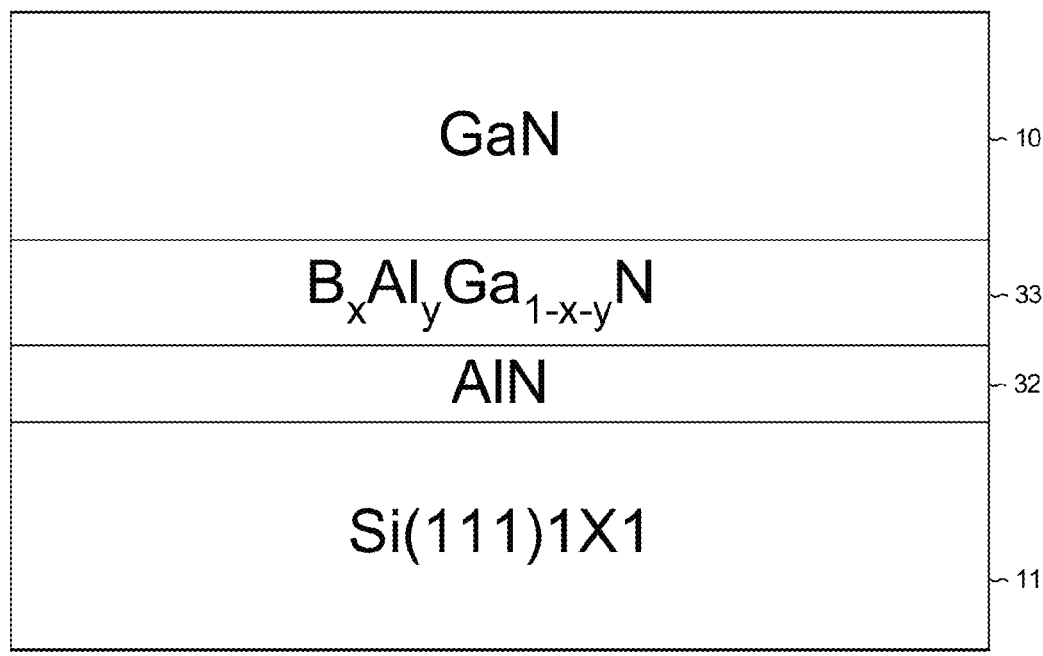
FIG. 14 is a cross-sectional view showing the growth of a single crystal GaN layer on buffer layers of AlN and BAlGaN over a silicon substrate.

FIG. 14 is a schematic diagram showing the growth of single crystal GaN layer 10 on buffer layers over a silicon substrate 11 in a second embodiment of the present invention. A buffer layer of aluminum nitride (AlN) 32 is first grown on the silicon substrate 11. Then higher buffer layers of boron aluminum gallium nitride ($B_xAl_yGa_{1-x-y}N$) 33 are grown over the aluminum nitride layer 32. Finally, the GaN layer 10 is grown over the top layer of boron aluminum gallium nitride 33.

By adding boron to reduce the lattice size of AlGaN, more compressive stress can be built up in thinner BAlGaN layers between the AlN and the GaN. The smaller lattice size of the BAlGaN crystal is used to build up compressive stress by growing successive buffer layers of boron aluminum gallium nitride ($B_xAl_yGa_{1-x-y}N$) 33 with increasingly larger lattice sizes. The lowest BAlGaN buffer layer has the most amount of boron and least amount of gallium, which produces the shortest cell unit length. The composition of each higher buffer layer of BAlGaN contains more gallium and less boron and aluminum in order to generate ever larger lattice sizes. Each upper crystal lattice must fit over a slightly smaller crystal lattice beneath it, thereby compressing the lattice of the upper layer. Finally, the gallium nitride layer is grown over the top buffer layer, and the lattice size of the gallium nitride is slightly larger than the top buffer layer of boron aluminum gallium nitride ($B_xAl_yGa_{1-x-y}N$), whose x and y values are small. The sum of the compressive stresses of each successive buffer layer offsets the tensile stress that results when the gallium nitride layer shrinks more than the silicon substrate shrinks as the wafer cools from growth temperature to room temperature. Because the lowest BAlGaN layer starts with a smaller lattice size, the buffer layers of BAlGaN can be thinner than buffer layers of AlGaN and still build up the same amount of compressive stress needed to offset the tensile stress between the GaN and silicon lattices. Moreover, by adding the boron to the AlGaN buffer layer, the thermal expansion coefficient of the layers of BAlGaN is reduced.

In a third embodiment, boron gallium nitride ($B_xGa_{1-x}N$) is used instead of boron aluminum gallium nitride ($B_xAl_yGa_{1-x-y}N$) as a buffer between the AlN layer and the GaN layer. The lowest BGaN buffer layer has the most amount of boron and the least amount of gallium. The composition of each higher buffer layer of BGaN contains more gallium and less boron in order to generate ever larger lattice sizes.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A device comprising:
   a substrate of silicon, wherein the substrate has a Si(111) 1×1 surface;
   a buffer layer of boron-aluminum nitride overlying the Si(111)1×1 surface of the substrate, wherein the boron-aluminum nitride has a composition of $B_xAl_{1-x}N$ wherein 0.35≤x≤0.45, and wherein the boron-aluminum nitride has a wurtzite-type crystal structure with a cell unit length in a C-plane that is between 64% and 68% of a cell unit length of the silicon on the Si(111)1×1 surface; and
   an upper layer of gallium nitride above the buffer layer.

2. The device of claim 1, wherein the boron-aluminum nitride has the wurtzite-type crystal structure with at least one layer in the C-plane having one atom of boron for each two atoms of aluminum.

3. The device of claim 1, wherein the silicon and boron-aluminum nitride are oriented as boron-aluminum nitride<0001>∥Si<111>.

4. The device of claim 1, wherein no amount of metallic aluminum is disposed between the substrate and the buffer layer.

5. The device of claim 1, further comprising: a second buffer layer comprising aluminum gallium nitride ($Al_y Ga_{1-y}N$), wherein the second buffer layer of aluminum gallium nitride is disposed between the buffer layer of boron-aluminum nitride and the upper layer of gallium nitride.

6. The device of claim 1, wherein the buffer layer of boron-aluminum nitride is between 100 and 150 nanometers thick.

7. The device of claim 1, wherein the substrate is an 8 inch diameter silicon wafer cut along a Si(111) plane, and wherein the entire wafer is formed so that nitrogen atoms of the boron-aluminum nitride form bonds to the Si(111)1×1 surface.

\* \* \* \* \*